United States Patent
Elyasi et al.

(10) Patent No.: US 10,970,204 B2
(45) Date of Patent: Apr. 6, 2021

(54) REDUCING READ-WRITE INTERFERENCE BY ADAPTIVE SCHEDULING IN NAND FLASH SSDS

(71) Applicant: Samsung Electronics Co., Ltd., Suwon-si (KR)

(72) Inventors: Nima Elyasi, State College, PA (US); Changho Choi, San Jose, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 9 days.

(21) Appl. No.: 15/832,681

(22) Filed: Dec. 5, 2017

(65) Prior Publication Data

US 2019/0065360 A1 Feb. 28, 2019

Related U.S. Application Data

(60) Provisional application No. 62/551,505, filed on Aug. 29, 2017.

(51) Int. Cl.
*G06F 3/06* (2006.01)
*G06F 12/02* (2006.01)
(Continued)

(52) U.S. Cl.
CPC .......... *G06F 12/0246* (2013.01); *G06F 3/061* (2013.01); *G06F 3/0659* (2013.01); *G06F 3/0665* (2013.01); *G06F 3/0679* (2013.01); *G06F 3/0688* (2013.01); *G06F 11/1072* (2013.01); *G06F 11/1076* (2013.01);
(Continued)

(58) Field of Classification Search
CPC .... G06F 13/16; G06F 13/1605; G06F 13/161; G06F 13/1621; G06F 13/1626; G06F 13/1642; G06F 13/1647; G06F 13/1673; G06F 13/1689; G06F 3/0659
See application file for complete search history.

(56) References Cited

U.S. PATENT DOCUMENTS 5,822,251 A * 10/1998 Bruce ................. G06F 11/1068
365/185.33
8,938,584 B2 1/2015 Nelogal et al.
(Continued)

OTHER PUBLICATIONS

Jeremic, et al.; Dataset Management-Aware Software Architecture for Storage Systems Based on SSDs, Article, 2012 IEEE Seventh International Conference on Networking, Architecture, and Storage, IEEE Conference, Jun. 28-30, 2012, pp. 288-292.
(Continued)

*Primary Examiner* — Charles Rones
*Assistant Examiner* — Hewy H Li
(74) *Attorney, Agent, or Firm* — Lewis Roca Rothgerber Christie LLP (57) ABSTRACT

A RAID-enabled solid state drive (SSD) including: a controller connected to a plurality of channels; a plurality of flash chip groups, each including a plurality of flash chips coupled to the plurality of channels, the plurality of flash chips including: a plurality of non-parity flash chips; and i parity flash chips, wherein the controller is configured to write data to the plurality of flash chip groups such that within each of the plurality of flash chip groups only i or less flash chips of the plurality of flash chips are allowed to be written to at the same time, where i is an integer equal to 1 or more.

20 Claims, 4 Drawing Sheets

(51) Int. Cl.
*G11C 16/10* (2006.01)
*G06F 11/10* (2006.01)
*G11C 16/26* (2006.01)

(52) U.S. Cl.
CPC .......... *G06F 12/0269* (2013.01); *G11C 16/10* (2013.01); *G11C 16/26* (2013.01)

(56) References Cited

U.S. PATENT DOCUMENTS

| | | | |
|---|---|---|---|
| 9,047,220 B2 | 6/2015 | Akutsu et al. | |
| 9,251,059 B2 | 2/2016 | Nemazie et al. | |
| 9,268,702 B2 | 2/2016 | Bilas et al. | |
| 9,319,073 B2 | 4/2016 | Alhussien et al. | |
| 9,432,298 B1 | 8/2016 | Smith | |
| 10,198,205 B1* | 2/2019 | Freilich | G06F 3/0634 |
| 2003/0165076 A1* | 9/2003 | Gorobets | G06F 3/0613 |
| | | | 365/200 |
| 2010/0049905 A1* | 2/2010 | Ouchi | G06F 1/3225 |
| | | | 711/103 |
| 2010/0185808 A1* | 7/2010 | Yu | G06F 13/1684 |
| | | | 711/103 |
| 2011/0078496 A1 | 3/2011 | Jeddeloh | |
| 2013/0166855 A1* | 6/2013 | Batwara | G06F 3/0608 |
| | | | 711/154 |
| 2013/0254454 A1* | 9/2013 | Ide | G06F 3/0688 |
| | | | 711/5 |
| 2014/0380092 A1* | 12/2014 | Kim | G06F 11/108 |
| | | | 714/6.24 |
| 2015/0220385 A1 | 8/2015 | Wood et al. | |
| 2015/0324145 A1 | 11/2015 | Akutsu et al. | |
| 2016/0246518 A1 | 8/2016 | Galbraith et al. | |
| 2017/0123682 A1 | 5/2017 | Sinclair | |
| 2017/0300383 A1 | 10/2017 | Kato | |
| 2017/0322845 A1 | 11/2017 | Nomura et al. | |
| 2017/0337212 A1 | 11/2017 | Hayasaka et al. | |
| 2018/0059976 A1 | 3/2018 | Helmick et al. | |

OTHER PUBLICATIONS

Pan et al.; Grouping-based Elastic Striping with Hotness Awareness for Improving SSD RAID Performance, Article, 2015 45th Annual IEEE/IFIP International Conference on Dependable Systems and Networks, IEEE, Jun. 22, 2015, pp. 160-171.

* cited by examiner

REDUCING READ-WRITE INTERFERENCE BY ADAPTIVE SCHEDULING IN NAND FLASH SSDS

CROSS-REFERENCE TO RELATED APPLICATION(S)

The present application claims priority to and the benefit of U.S. Provisional Application No. 62/551,505, filed Aug. 29, 2017, titled "REDUCING READ-WRITE INTERFERENCE BY ADAPTIVE SCHEDULING AND DATA PLACEMENT IN NAND FLASH SSDs", the entire content of which is incorporated herein by reference.

FIELD

One or more aspects of embodiments according to the present invention relate to NAND flash SSDs and more particularly to reducing read-write interference in NAND flash SSDs.

BACKGROUND

Solid State Drives (SSDs) usually employ many flash chips, clustered into several groups, each group connected to an SSD controller through independently-functioning data buses, called channels. Each flash chip contains multiple planes to offer higher levels of parallelism. A plane includes hundreds/thousands of blocks, each containing hundreds of pages. A page is the smallest granularity for any read/write operation on an SSD.

There are three different types of operations on SSDs: read, program, and erase. To store or write data on an SSD, a program operation is done that requires a long-latency erase operation beforehand which takes place in block-level granularity. To avoid having each program operation suspended by an erase operation, SSDs take advantage of a no-write-in-place property which requires (i) storing mapping information for logical and physical addresses in FTL tables and (ii) a garbage collector that is periodically invoked to free up the space. The garbage collection process undergoes two phases: (i) reading valid data out of a victim block (i.e., the block targeted by the garbage collection) and (ii) writing it back to another block.

Efforts in exploiting a high level of SSD internal parallelism as well as the read-write-erase disparity results in long delays in service of some read requests. Thus, the latencies of some read requests are increasing dramatically, leading to a long read tail latency from the SSD, which in turn violates the latency Service Level Objectives (SLOs). Database and storage service providers, such as Facebook® and Amazon®, on the other hand, need SSDs to meet latency SLOs for even $99.99^{th}$ percentiles. The sources of large read tail latency are threefold: (i) read-read interference, (ii) read-write interference, and (iii) read-erase interference. However, (ii) is the main source of read tail latency due to relatively long latency of write/program operations compared to read operation and high frequency of write/program operation compared to erase operation.

SUMMARY

Aspects of embodiments according to the present invention relate to reducing or minimizing read-write and read-erase interferences in a RAID-equipped SSD (or RAID-enabled SSD) in the hope of reducing read tail latency. To this end, embodiments of the present invention may include a novel scheduling and data placement mechanisms through which flash chips are clustered into several groups. In each group, writes are confined to only one flash chip at any given time and are rotated over the other flash chips in the group in a round-robin fashion. Reads, targeting the program-busy flash chip, will be reconstructed having the parity of each group, which is stored in a parity-holding flash chip in each group.

To further reduce the interference between read and program/erase operations induced by garbage collection, embodiments of the present invention may disaggregate the user writes and garbage collection writes to prevent valid data movements cascading to next GC cycles, thereby reducing or minimizing GC frequency and movement costs and reducing the long read tail latency induced by GC writes and erase operations.

According to an embodiment of the present invention, there is provided a RAID-enabled solid state drive (SSD) including: a controller connected to a plurality of channels; a plurality of flash chip groups, each including a plurality of flash chips coupled to the plurality of channels, the plurality of flash chips including: a plurality of non-parity flash chips; and i parity flash chips, wherein the controller is configured to write data to the plurality of flash chip groups such that within each of the plurality of flash chip groups only i or less flash chips of the plurality of flash chips are allowed to be written to at the same time, where i is an integer equal to 1 or more.

The controller may be further configured such that when a read request is received for one of the non-parity flash chips that is currently being written to, read data is reconstructed from data stored in the other non-parity flash chips and the parity flash chip within the same flash chip group. The controller may be further configured such that writes to the plurality of flash chips within a same flash chip group of the plurality of flash chip groups occur consecutively and the parity flash chip is written to last.

The controller may be further configured such that a garbage collection write point is separate from a user write point. The controller may be further configured such that when data is moved during a garbage collection cycle, the data is placed based on the garbage collection write point, and the garbage collection write point is incremented. The controller may be further configured such that when data is stored due to a user write, the data is placed based on the user write point, and the user write point is incremented.

Each flash chip of the plurality of flash chips of one flash chip group may be coupled to a different one of the channels. Each flash chip of the plurality of flash chips of one flash chip group may be coupled to a same one of the channels.

The i parity flash chips may include only one parity flash chip. Flash chips of different flash chip groups that are coupled to a same channel may be written to at a same time. Flash chips of different flash chip groups that are coupled to different channels may be written to at a same time.

According to an embodiment of the present invention, there is provided a RAID-enabled solid state drive (SSD) including: a controller connected to a plurality of channels; a plurality of flash chip groups, each including a plurality of flash chips coupled to the plurality of channels, the plurality of flash chips including: a plurality of non-parity flash chips; and i parity flash chips, where i is an integer equal to 1 or more, wherein the controller is configured to write data to the plurality of flash chip groups such that a garbage collection write point is separate from a user write point.

When data is moved during a garbage collection cycle, the data may be placed based on the garbage collection write point, and the garbage collection write point is incremented. When data is stored due to a user write, the data may be placed based on the user write point, and the user write point is incremented.

The controller may be further configured to write data to the plurality of flash chip groups such that within each of the plurality of flash chip groups only one of the plurality of flash chips is allowed to be written to at the same time. The controller may be further configured such that when a read request is received for one of the non-parity flash chips that is currently being written to, read data is reconstructed from data stored in the other non-parity flash chips and the parity flash chip within the same flash chip group.

According to an embodiment of the present invention, there is provided a method of processing a request via a controller of a RAID-enabled solid state drive (SSD), the method including: selecting the request from a request queue, the request being directed to a request flash chip; determining if the request is a read request; and when the request is a read request: resetting α; determining if equation (1) holds:

$$T_{RemainingWrite} > \alpha(T_{Read} + T_{channelXfer}); \text{ and} \qquad (1)$$

when the equation does not hold, issuing the request to the chip that holds the data, wherein α, which is a decision making factor, is an iteration parameter, $T_{RemainingWrite}$ is an amount of time remaining before a current write is complete, $T_{Read}$ is an amount of time required to perform a read from a chip, and $T_{channelXfer}$ is an amount of time required to transfer data over a channel from a chip to memory.

When the request is a read request and the equation does hold, the method may further include reconstructing the request by reading from other flash chips within a same flash chip group as the request flash chip. When the request is a write request, the method may further include: incrementing α using the following equation:

$$\alpha = \alpha * \beta,$$

where β is an increment parameter; determining if equation (1) holds; and when the equation does not hold (meaning that the current write operation will complete soon), issuing a write on a next flash chip in the same flash chip group.

When the request is a write request and equation (1) holds, the request may not be scheduled, meaning that it should wait until the current write completes to avoid a situation where no write operation occurs at the same time.

BRIEF DESCRIPTION OF THE DRAWINGS

These and other features and aspects of the present invention will be appreciated and understood with reference to the specification, claims, and appended drawings wherein:

DETAILED DESCRIPTION

The detailed description set forth below in connection with the appended drawings is intended as a description of exemplary embodiments provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. Further, one of ordinary skill in the art would appreciate that features of one or more embodiments according to the present invention may be combined in a suitable manner to practice other embodiments of the present invention. As denoted elsewhere herein, like element numbers are intended to indicate like elements or features.

In NAND flash solid state drives (SSDs) including several flash chips, read requests to a specific flash chip can experience large delays in their service due to an ongoing long-latency program/erase operation in the target flash chip. The program operation typically takes much longer (10×-20×) than read latency to complete. Despite efforts in prioritizing reads over writes, when a read request is directed to a flash chip that is busy with a program operation, the read itself and consequent reads to the same flash chip will be delayed, resulting in considerable read tail latency due to the disparity in read, program, and erase operations latency.

To address reducing or minimizing the large read tail latency induced by an ongoing program/erase operation, embodiments of the present invention may include a novel scheduling mechanism for read and write requests to an SSD, through which a read request to a busy flash chip can be reconstructed and serviced quickly rather than waiting for the program/erase operation to complete.

Aspects of embodiments according to the present invention relate to reducing or minimizing read-write interference in a RAID-equipped SSD in the hope of reducing read tail latency. To this end, embodiments of the present invention may include novel scheduling and data placement mechanisms through which flash chips are clustered into several groups. In each group, writes are confined to only one flash chip at any given time and are rotated over the other flash chips in the group in a round-robin fashion. Reads, targeting the program-busy flash chip, will be reconstructed having the parity of each group, which is stored in a parity-holding flash chip in each group.

To further reduce the interference between read and program/erase operations induced by garbage collection, embodiments of the present invention may disaggregate the user writes and garbage collection writes to prevent valid data movements cascading to the next garbage collection (GC) cycles, thereby reducing or minimizing GC frequency and movement costs, and reducing the long read tail latency induced by GC writes and erase operations.

Figure 1:
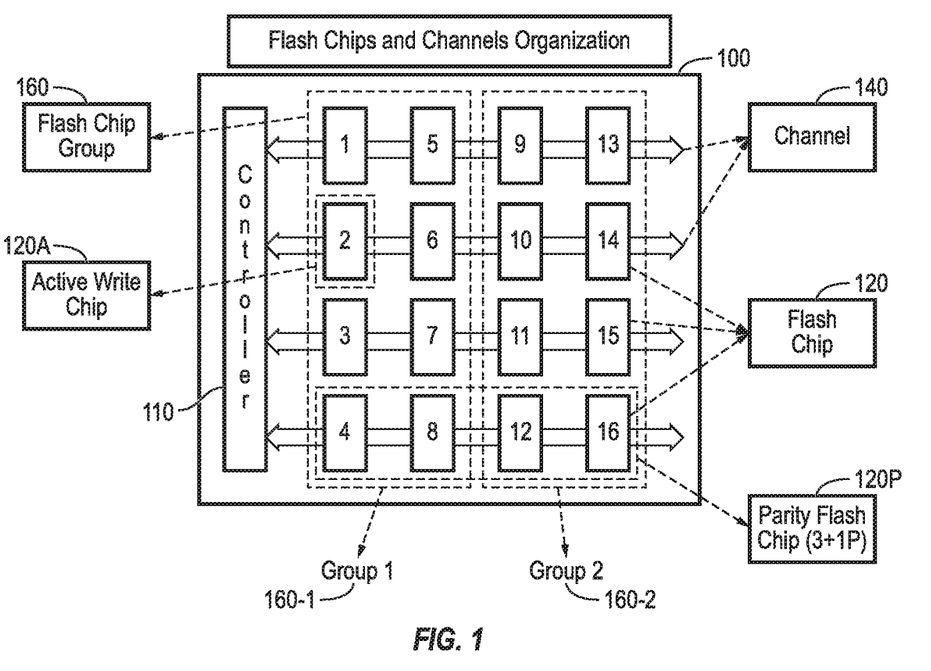
FIG. 1 illustrates a representative organization for SSD channels and flash chips according to an embodiment of the present invention.

FIG. 1 illustrates a representative organization for SSD channels and flash chips according to an embodiment of the present invention.

In this example, SSD 100 has four channels 140, each containing four flash chips 120. Each of the channels 140 is connected or coupled to a controller 110. Moreover, in this example, the RAID-equipped SSD 100 employs 3+1 parity (or 6+2 parity), i.e., there are three non-parity flash chips for each parity flash chip 120P. Several flash chips 120 are grouped together into a flash chip group 160 (e.g., flash groups 160-1 and 160-2).

As shown in FIG. 1, there are two groups 160, each operating independently. In each group 160, several flash chips 120 are involved; however, there is at most one active write flash chip 120A in each group 160, i.e., one write/program operation occurs in each group 160 at any time. Once the write completes, the next write directed to the next flash chip 120 in the same group occurs. Note that while there is only one write point in a flash chip group, other groups can service write requests directed to flash chips associated with those groups. Thus, the controller 110 according to embodiments of the present invention may enforce the one write point per group rule by directing writes waiting for each group to get serviced one by one and do not allow more than one write point in each group at any time.

If a read targets any flash chip 120 in a group other than the active write flash chip 120A, it can be serviced through regular procedure. However, if a read targets the active write flash chip 120A which is busy servicing a write request, it could be reconstructed by reading the corresponding pages from other flash chips 120 in the same group 160 and XORing (or reconstructing) the read data. As a further example, in some encoding schemes example, if a read request is targeting flash chip 2 (which is the current active write flash chip 120A), the requested data from flash chip 2 can be constructed by (i) reading respective pages from flash chip 1, flash chip 3, and flash chip 4 (the parity flash chip 120P) and (ii) XORing the data read from aforementioned flash chips 120.

Figure 2:
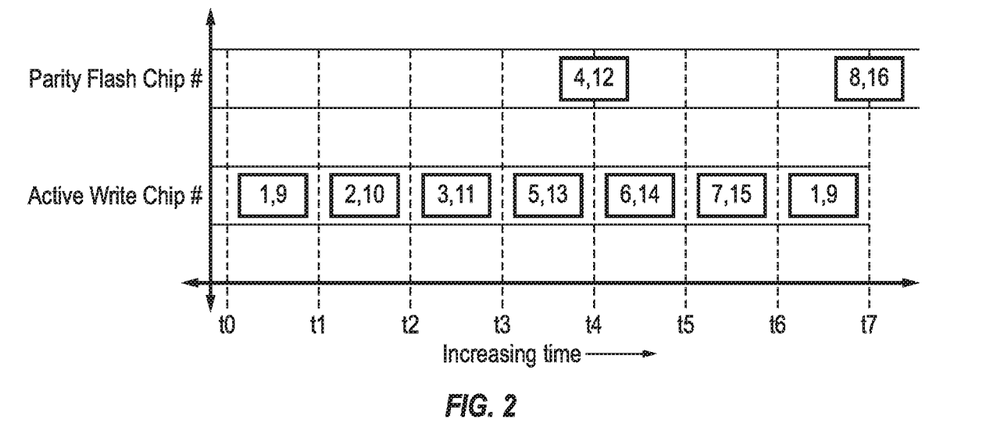
FIG. 2 illustrates a timeline of write operations occurring in the SSD according to the example given in FIG. 1.

FIG. 2 illustrates a timeline of write operations occurring in the SSD 100 according to the example given in FIG. 1.

From time t0 to t1, two page writes can be serviced, one directed to each of flash chips 1 and 9 in each of the respective groups 160-1 and 160-2. In this time interval, if any read happens to the write-busy flash chips, the requested data can be reconstructed as explained above. Once writes complete on the flash chips of a group, the parity chips are updated, if required, and then that group begins again to service writes targeting it, the schedule repeats. Thus at time t4, the parity flash chips 4 and 12 can be updated and any required program operation can take place at this time.

While in each group the flash chip writes and parity updates are decoupled and the parity updates are delayed, this constraint need not be held globally with regard to all flash chips in all groups. Rather, this constraint is held locally with regard to flash chips forming a group. In the example shown, parity updates of all groups are happening concurrently when no write happens in any of the flash chips; however, while the parity flash chip in a group is busy updating the required parity pages, writes to any other group can be serviced.

The write points rotate in each group and the parity is updated once the writes are finished. Once the flash chip 4 is busy updating the required parity blocks, any read to flash chips 1-3 can be serviced without encountering any ongoing program operation in these flash chips. In addition, reads to flash chips 5-7 undergo the same process, leading to no read getting blocked due to an ongoing program operation.

Figure 3:
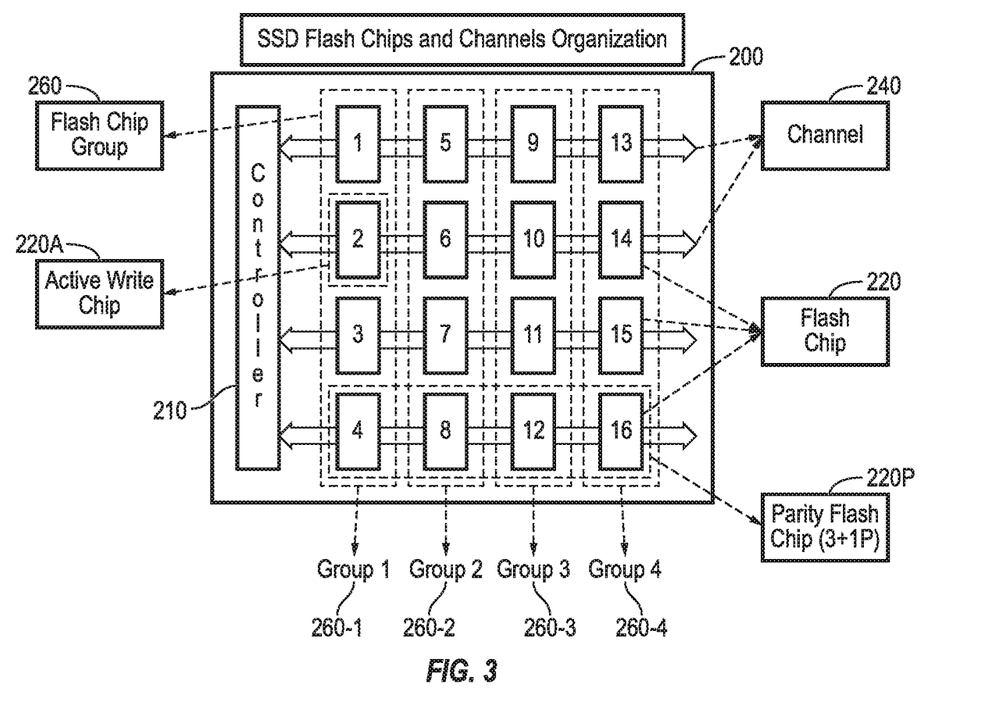
FIG. 3 illustrates a representative organization for SSD channels and flash chips according to another embodiment of the present invention.

FIG. 3 illustrates a representative organization for SSD channels and flash chips according to another embodiment of the present invention.

In this example, the SSD 200 has four channels 240, each containing four flash chips 220. Each of the channels 240 is connected or coupled to a controller 210. Moreover, in this example, the RAID-equipped SSD 200 employs 3+1 parity, i.e., there are three non-parity flash chips for each parity flash chip 220P. Several flash chips 220 are grouped together into a flash chip group 260 (e.g., flash group 260-1, flash group 260-2, flash group 260-3, and flash group 260-4).

As shown in FIG. 3, there are four groups 260, each operating independently. In each group 260, several flash chips 220 are involved; however, there is at most one active write flash chip 220A in each group 260, i.e., one write/program operation occurs in each group 260 at any time. Once the write completes, the next write directed to the next flash chip 220 in the same group occurs. Note that while there is only one write point in a flash chip group, other groups can service write requests directed to flash chips associated with those groups. Thus, the controller 210 according to embodiments of the present invention may enforce the one write point per group rule by directing writes waiting for each group to get serviced one by one and do not allow more than one write point in each group at any time.

If a read targets any flash chip 220 in a group other than the active write flash chip 220A, it can be serviced through the regular procedure. However, if a read targets the active write flash chip 220A which is busy servicing a write request, it could be reconstructed by reading the corresponding pages from other flash chips 220 in the same group 260 and reconstructing the read data. As an example, in some forms of encoding, if a read request is targeting flash chip 2 (which is the current active write flash chip 220A), the requested data from flash chip 2 can be constructed by (i) reading respective pages from flash chip 1, flash chip 3, and flash chip 4 (the parity flash chip 220P) and (ii) XORing the data read from aforementioned flash chips 220.

Figure 4:
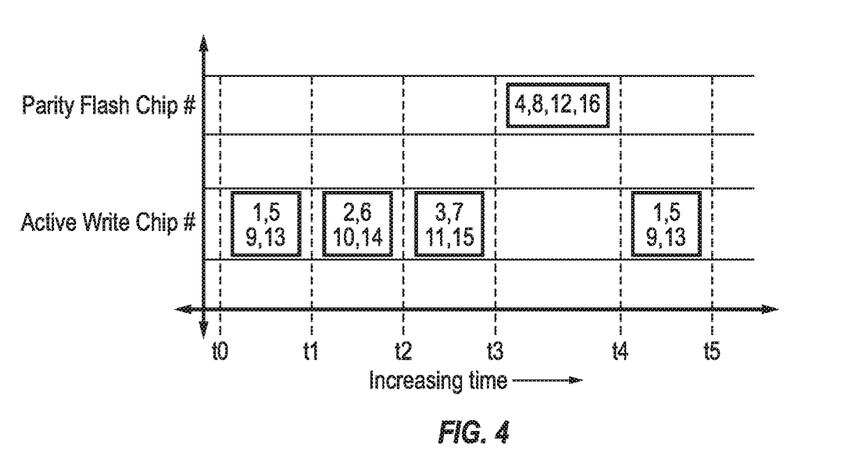
FIG. 4 illustrates a timeline of write operations occurring in the SSD according to the example given in FIG. 3.

FIG. 4 illustrates a timeline of write operations occurring in the SSD 200 according to the example given in FIG. 3.

From time t0 to t1, four page writes are directed to flash chips 1, 5, 9, and 13, each in a respective flash group 260. In this time interval, if any read happens to the write-busy flash chips, the requested data can be reconstructed as explained above. Once writes complete on flash chips of a group, the parity chips are updated, if required, and then the schedule repeats. Thus from time t3 to time t4, the parity flash chips 4, 8, 12, and 16 can be updated and any required program operation can take place at this time.

While in each group the flash chip writes and parity updates are decoupled and the parity updates are delayed, this constraint need not be held globally with regard to all flash chips in all groups. Rather, this constraint is held locally with regard to flash chips forming a group. In the example shown, parity updates of all groups are happening concurrently when no write happens in any of the normal flash chips; however, while the parity flash chip in a group is busy updating the required parity pages, writes to any other groups can be serviced.

The write points rotate in each group and the parity is updated once the writes are finished. Once the flash chip 4 is busy updating the required parity blocks, any read to flash chips 1-3 can be serviced without encountering any ongoing program operation in these flash chips. In addition, reads to other flash chips undergo the same process, leading to no read getting blocked due to an ongoing program operation.

Referring to FIGS. 1-4, while the embodiments of FIGS. 1-4 show all of the writes (one per each group) occurring on the same channels at the same time, the present invention is not limited thereto. In addition, writes may occur in each group independently from when writes occur in any other group. For example, writes may overlap in flash chips 1 and 14 or they may overlap in flash chips 1 and 16, or in any other suitable combination wherein only one write is occurring per group.

Further, referring to FIGS. 1-4, while the embodiments of FIGS. 1-4 show only one write per each group, the present invention is not limited thereto. For example, in a case in which each flash chip group includes two parity chips, two writes may occur at the same time within the same group. In general, when each flash chip group includes i parity flash chips, i writes may occur at the same time within each flash chip group, where i is an integer equal to 1 or more. When the number of writes with a flash chip group is equal to or less than the number of parity flash chips within the flash chip group, read requests may be reconstructed when the read is directed to one of the flash chips being written to.

Further, prior to or at the time of each write being processed in each non-parity flash chip, the data in the non-parity flash chip may be stored in temporary memory (e.g., a cache) in order for the correct data to be available for XORing when a read request is made. This may occur every time a write occurs, or this may occur only when the write is changing or deleting data from a chip. Further, this may not occur when the last of the non-parity chips is being written and/or when the parity chip is being written.

For example, when flash chip 1 is going to be written and the data is going to change, prior to or at the time at which a write is occurring at flash chip 1, the data stored in flash chip 1 is saved in temporary memory. If a read is then received for flash chip 2 while flash chip 2 is being written, the data may be incorrectly read using the embodiments described above with reference to FIGS. 1-4. For example, if the data in flash chip 1 was changed, and the parity chip has not been updated yet (as may be the case if flash chip 2 is still being written), the correct data may not be received by XORing the data in flash chips 1, 3, and 4.

In this case, the data can be correctly read by XORing the stored old data for flash chip 1 and the current data in flash chips 3 and 4. The same would be true of data changed in the previous writes of flash chips 1 and 2 when flash chip 3 is being written.

While the embodiments described in reference to FIGS. 1-4 have a 3+1P structure, the present invention is not limited thereto and other parity structures may be used. For example, a 2+1P, a 4+1P, a 3+2P, a 4+2P, etc., may be used instead of or in addition to the 3+1P described above. Likewise, a 4×4 set of chip is just an example, and the chips could have any suitable number of channels or chips per channel.

Further, referring to FIGS. 2 and 4, although it is shown that flash chips of different flash chip groups that are coupled to a same channel are written to at a same time, the present invention is not limited thereto and flash chips of different flash chip groups that are coupled to a same channel may be written to at different times and/or flash chips of different flash chip groups that are coupled to different channels may be written to at a same time.

Figure 5:
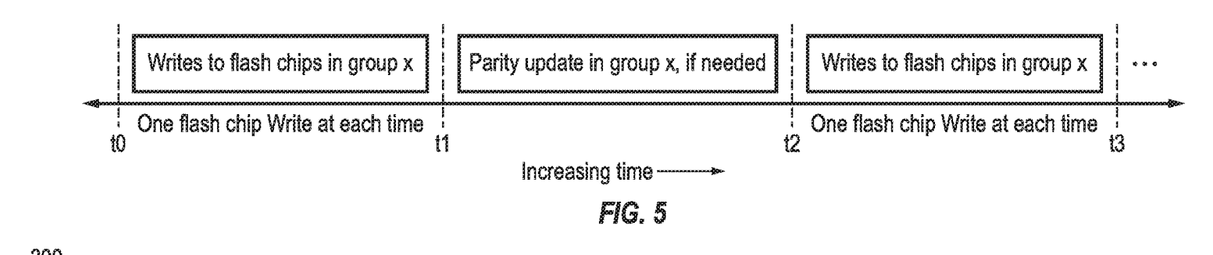
FIG. 5 illustrates a scheduling process according to an embodiment of the present invention.

FIG. 5 illustrates a scheduling process according to an embodiment of the present invention. According to an embodiment of the present invention, the sequence of events happening in each flash group is shown in FIG. 5.

As shown in FIG. 5, for a flash group x (in this example), writes occur in the flash chips of group x (e.g., in the non-parity flash chips of group x). Once writes issued to the flash chips in group x in a consecutive manner are completed, the parity flash chip in group x updates the required parity pages depending on the RAID implementation. Upon completion of updating the parity flash chip in group x, the process may be repeated.

Figure 6A:
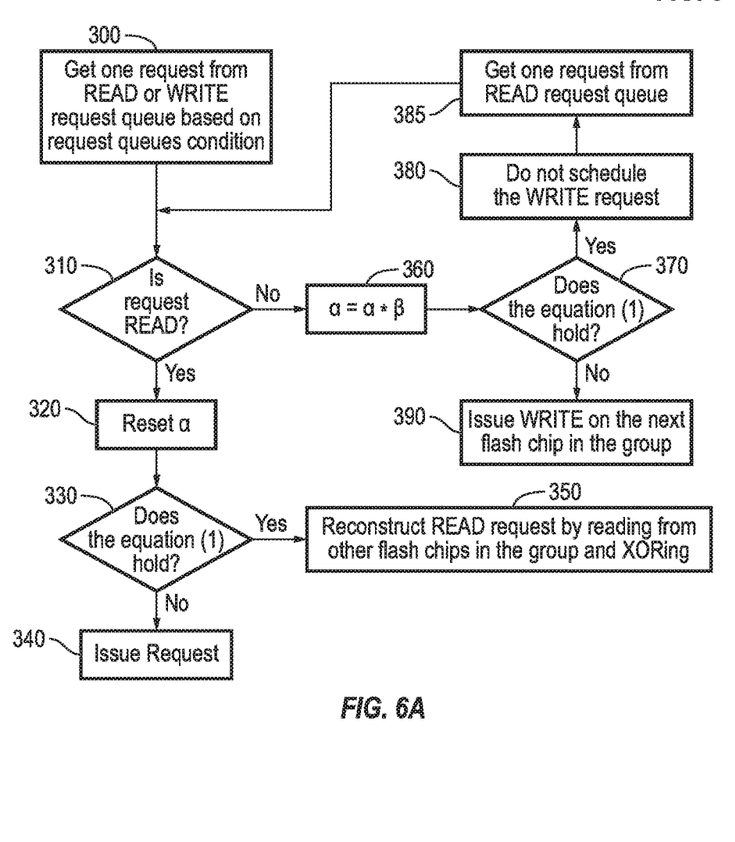
FIG. 6A illustrates a method of deciding read and write scheduling according to an embodiment of the present invention.
Figure 6B:
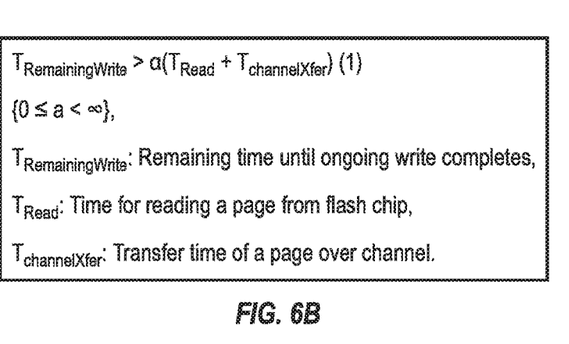
FIG. 6B illustrates an equation used in deciding read and write scheduling according to an embodiment of the present invention.

FIG. 6A illustrates a method of deciding read and write scheduling according to an embodiment of the present invention, and FIG. 6B illustrates an equation used in deciding read and write scheduling according to an embodiment of the present invention. Further, FIGS. 6A and 6B illustrate a method of processing a request via a controller of a RAID-enabled solid state drive (SSD) to read data from or write data to a flash chip (e.g., a request flash chip).

While performing complementary scheduling, delaying parity updates, and performing read reconstruction mechanisms, which may reduce read-write interference on flash chips and in turn dramatically reduce read tail latency, the embodiments described above have at least three additional consequences: (i) confining writes to only a subset of flash chips impedes utilizing the high levels of parallelism provided in SSDs, thereby degrading write performance; (ii) the mechanism is functioning statically and is not able to capture the workload dynamism, and (iii) reconstructing each read requires additional read operations. We address these issues by proposing an adaptive decision-making process that may greatly alleviate these drawbacks.

As described above, there are two main decisions throughout execution: (i) write scheduling decisions, and (ii) read reconstruction decisions. If the decisions are made statically, without taking any I/O workload and device behavior into account, writes to the SSD will experience very large latencies.

Referring to FIGS. 6A and 6B, the decision making process may adapt itself to the workload dynamism and device intrinsic characteristics of an SSD based on Equation (1) shown in FIG. 6B. For instance, if a workload generates only write requests for a long time interval, the equation adapts itself to avail more flash chips to the incoming write requests. On the other hand, upon arrival of a read, the Equation (1) confines writes to fewer flash chips in order to reduce the read-write interferences.

The procedure associated with decision-making process and updating required parameters is shown in FIG. 6A. As demonstrated in FIG. 6A, anytime the scheduler (e.g., the controller) picks a request, based upon the request's type and the state of flash chips in a group, the scheduler decides whether or not to service the request (for write), and whether or not to reconstruct data (for read). More precisely, if the request is a write, the controller checks whether there is any group with either no ongoing program operation or close-to-end program operation.

The close-to-end could be determined by checking Equation (1), which employs a parameter $\alpha$ that is updated in each iteration by multiplying it to a constant parameter ($\beta$). If $T_{RemainingWrite} \leq \alpha(T_{Read} + T_{channelXfer})$, meaning that the current ongoing write operation would finish soon, the write operation would be initiated in the next chip in the group as shown in FIG. 6A. $T_{RemainingWrite}$ is the amount of time remaining before the current write is complete, $T_{Read}$ is the amount of time required to perform a read, and $T_{channelXfer}$ is the amount of time required to transfer data over a channel from a chip to memory. The required parameters could be easily stored in few registers in the device controller. For a read request, on the other hand, after the iteration parameter α is reset, if the Equation (1) does not hold, the read is scheduled to the target flash chip, otherwise it will be reconstructed through the process explained above.

In more detail, the scheduler selects a request from the request queue at 300. For example, one READ request queue and one WRITE request queue may be maintained. When the READ request queue is empty or the WRITE queue is more than x % (e.g., 80%) full, then the scheduler processes one WRITE request in WRITE request queue. Otherwise, it processes a READ request.

The scheduler determines if the request is a read request at 310.

If the request is a read request, the scheduler resets α at 320 (e.g., α may be reset to 2). Then the scheduler determines whether Equation (1) holds at 330. If Equation (1) does not hold, then the read request is issued at 340. If Equation (1) holds, then the read request is reconstructed by reading from other flash chips in the group and XORing at 350.

If the request is not a read request, the scheduler sets α equal to α times β at 360, where β is an increment parameter (e.g., β may be equal to 1.001). The scheduler then determines whether Equation (1) holds at 370. If Equation (1) holds, then the request is not scheduled at 380. If Equation (1) does not hold, then a write is issued on the next flash chip in the group at 390.

When the request is not scheduled at 380, then one request is gotten from the read request queue at 385 and the method may begin again starting at 310.

Figure 7:
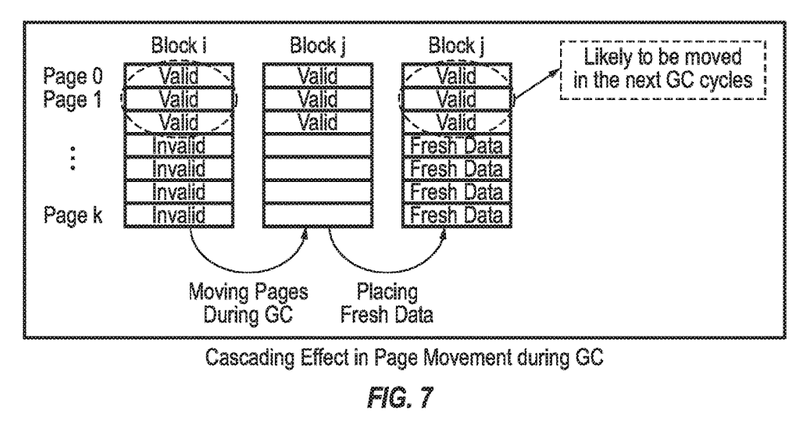
FIG. 7 illustrates an example of a garbage collection cycle.

FIG. 7 illustrates an example of a garbage collection cycle.

To further reduce the interference between read and program/erase operations induced by garbage collection, the user writes and garbage collection writes may be disaggregated to prevent valid data movements cascading to next GC cycles, thereby reducing or minimizing GC frequency and movement costs and reducing the long read tail latency induced by GC writes and erase operations.

FIG. 7 shows an example of a garbage collection cycle. Through this process, a block (Block i in this example) is selected as a victim block. After moving the valid pages to another block, this block is erased. Once the valid data is moved to a new block, the rest of this block will be filled with fresh writes. Co-locating fresh writes and old valid data (which tends to remain valid for a long time) may result in a cascading effect in page movements in the next GC cycles. In other words, it is very likely that the valid data moved in past GC cycles will also be moved in the next (or subsequent) GC cycles. Thus, embodiments of the present invention may disaggregate GC writes and user (fresh) writes in order to reduce or eliminate this effect, consequently reducing GC-induced writes in each GC cycle as well as the frequency of GC.

Figure 8:
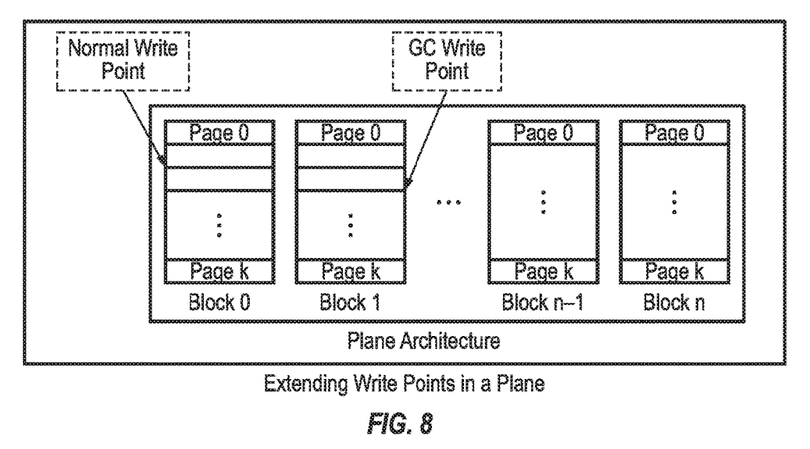
FIG. 8 illustrates extending write points in a plane.

FIG. 8 illustrates extending write points in a plane.

To handle GC operation, embodiments of the present invention perform intra-flash chip GC. Intra-flash chip GC is a performance-efficient way of conducting GC because it does not require any data transfer over channels nor any parity updates due to valid page movements.

To integrate intra-flash chip GC, Equation (1) is updated to $T_{RemainingWriteOrErase} > \alpha(T_{Read} + T_{channelXfer})$. In addition, the number of write points in each plane is extended to one normal write point (or user write point) and one garbage collection write point (or GC write point). The former is used for user (fresh) writes and the latter is employed to service writes induced by GC. Related art SSDs employ only one write point in each plane. This write point is incremented upon a page write and points to the next available page in the plane for servicing the next write directed to this plane. However, in order to segregate GC writes and user (fresh) writes, as shown in FIG. 7, embodiments of the present invention may add another write point, called a GC write point. Using the GC write point, any writes invoked for the data movement during a GC cycle will be directed and placed based on the GC write point. These two write points work independently and do not conflict on a block (i.e., the two write points cannot point to the same block at the same time). GC writes are directed to the block associated with the GC write point, and user (fresh) writes are directed to the block that the normal write point is pointing to. Thus, user (fresh) writes are accumulated in some blocks of a plane and GC writes are written to some other blocks in the same plane.

Figure 9:
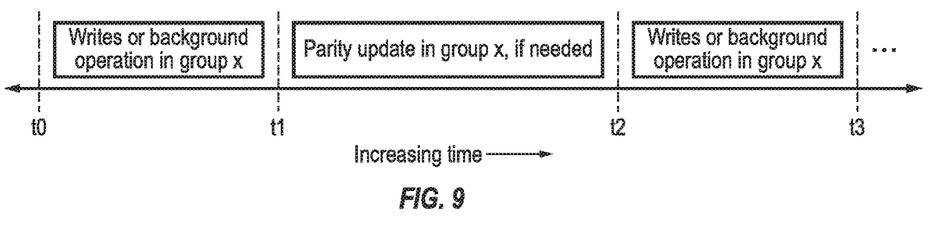
FIG. 9 illustrates a scheduling process according to an embodiment of the present invention.

FIG. 9 illustrates a scheduling process according to an embodiment of the present invention.

When GC functionality is added, FIG. 5 is updated as shown in FIG. 9. As shown in FIG. 9, at each time either write, background operation, or parity update is going on in each group. Further, once a group is doing any background operation (such as GC), no writes are issued on any flash chips on that group.

However, similar to the embodiments described above, while a group is busy with a write or background operation, other flash chips in other groups could service the write or background operations waiting to get service on flash chips associated with those groups. Given the example in FIG. 3, if group 1 is in background operation mode, flash chips from groups 2-4 can service any writes or background operations waiting for them to get serviced while following the one write or background operation in each group at any time constraint/rule.

Aspects of embodiments according to the present invention relate to reducing or minimizing read-write interference in a RAID-equipped SSD in the hope of reducing read tail latency. To this end, embodiments of the present invention may include novel scheduling and data placement mechanisms through which flash chips are clustered into several groups. In each group, writes are confined to only one flash chip at any given time and are rotated over the other flash chips in the group in a round-robin fashion. Reads, targeting the program-busy flash chip, will be reconstructed having the parity of each group, which is stored in a parity-holding flash chip in each group.

To further reduce the interference between read and program/erase operations induced by garbage collection, embodiments of the present invention may disaggregate the user writes and garbage collection writes to prevent valid data movements from cascading to next GC cycles, thereby reducing or minimizing GC frequency and movement costs and reducing the long read tail latency induced by GC writes and erase operations.

A relevant device or component (or relevant devices or components) according to embodiments of the present invention described herein may be implemented utilizing any suitable hardware (e.g., an application-specific integrated circuit), firmware (e.g., a DSP or FPGA), software, or a suitable combination of software, firmware, and hardware. For example, the various components of the relevant device(s) may be formed on one integrated circuit (IC) chip or on separate IC chips. Further, the various components of the relevant device(s) may be implemented on a flexible printed circuit film, a tape carrier package (TCP), a printed circuit board (PCB), or formed on a same substrate as one or more circuits and/or other devices. Further, the various components of the relevant device(s) may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Furthermore, "connection," "connected," etc., may also refer to "electrical connection," "electrically connected," etc., depending on the context in which such terms are used as would be understood by those skilled in the art. When an element or layer is referred to as being "directly on," "directly connected to," "directly coupled to," "directly connected with," "directly coupled with," or "immediately adjacent to" another element or layer, there are no intervening elements or layers present.

As used herein, "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Features described in relation to one or more embodiments of the present invention are available for use in conjunction with features of other embodiments of the present invention. For example, features described in a first embodiment may be combined with features described in a second embodiment to form a third embodiment, even though the third embodiment may not be specifically described herein.

Although this invention has been described with regard to certain specific embodiments, those skilled in the art will have no difficulty devising variations of the described embodiments, which in no way depart from the scope and spirit of the present invention. Furthermore, to those skilled in the various arts, the invention itself described herein will suggest solutions to other tasks and adaptations for other applications. It is the Applicant's intention to cover by claims all such uses of the invention and those changes and modifications which could be made to the embodiments of the invention herein chosen for the purpose of disclosure without departing from the spirit and scope of the invention. Thus, the present embodiments of the invention should be considered in all respects as illustrative and not restrictive, the scope of the invention to be indicated by the appended claims and their equivalents.

What is claimed is:

1. A solid state drive (SSD) comprising:
   a controller connected to a plurality of channels;
   a plurality of flash chip groups, each of the plurality of flash chip groups comprising a plurality of flash chips coupled to the plurality of channels, the plurality of flash chips in each of the plurality of flash chip groups comprising:
   a plurality of non-parity flash chips; and
   i parity flash chips, where i is an integer equal to or greater than 1,
   wherein the controller is configured to write data to the plurality of flash chip groups such that within each of the plurality of flash chip groups only i or less flash chips of the plurality of flash chips are allowed to be written to at the same time wherein in response to receiving a write request, the controller is configured to issue a write on a next flash chip in the same flash chip group based on an amount of time remaining before a current write is complete, an amount of time required to perform a read from a chip, and an amount of time required to transfer data over a channel from a chip to a memory.

2. The SSD of claim 1, wherein the controller is further configured to:
   receive a read request for one of the non-parity flash chips that is being written to, and
   generate read data from data stored in the other non-parity flash chips and the i parity flash chips within the same flash chip group.

3. The SSD of claim 1, wherein the controller is further configured to write consecutively to the plurality of flash chips within a same flash chip group of the plurality of flash chip groups, wherein the i parity flash chips are written to last.

4. The SSD of claim 1, wherein the controller is further configured such that a garbage collection write point is separate from a user based write point.

5. The SSD of claim 4, wherein the controller is further configured to:
   based on data being moved during a garbage collection cycle, store the data based on the garbage collection write point, and
   increment the garbage collection write point.

6. The SSD of claim 4, wherein the controller is further configured to:
based on data being stored due to a user based write, store the data based on the user based write point, and increment the user based write point.

7. The SSD of claim 1, wherein each flash chip of the plurality of flash chips of one flash chip group is coupled to a different one of the channels.

8. The SSD of claim 1, wherein each flash chip of the plurality of flash chips of one flash chip group is coupled to a same one of the channels.

9. The SSD of claim 1, wherein the i parity flash chips comprises one parity flash chip.

10. The SSD of claim 1, wherein the controller is further configured such that flash chips of different flash chip groups that are coupled to a same channel are written to at a same time.

11. The SSD of claim 1, wherein the controller is further configured such that flash chips of different flash chip groups that are coupled to different channels are written to at a same time.

12. A solid state drive (SSD) comprising:
a controller connected to a plurality of channels;
a plurality of flash chip groups, each of the plurality of flash chip groups comprising a plurality of flash chips coupled to the plurality of channels, the plurality of flash chips in each of the plurality of flash chip groups comprising:
a plurality of non-parity flash chips; and
i parity flash chips, where i is an integer equal to 1 or more,
wherein the controller is configured to write data to the plurality of flash chip groups such that a garbage collection write point is separate from a user based write point,
wherein in response to receiving a write request, the controller is configured to issue a write on a next flash chip in the same flash chip group based on an amount of time remaining before a current write is complete the controller is configured to issue a write on a next flash chip in the same flash chip group based on an amount of time remaining before a current write is complete, an amount of time required to perform a read from a chip, and an amount of time required to transfer data over a channel from a chip to a memory.

13. The SSD of claim 12, wherein the controller is further configured to:
based on data being moved during a garbage collection cycle, store the data based on the garbage collection write point, and
increment the garbage collection write point.

14. The SSD of claim 13, wherein the controller is further configured to:
based on data being stored due to a user based write, store the data based on the user based write point, and
increment the user based write point.

15. The SSD of claim 14, wherein the controller is further configured to write data to the plurality of flash chip groups such that within each of the plurality of flash chip groups only one of the plurality of flash chips is allowed to be written to at the same time.

16. The SSD of claim 15, wherein the controller is further configured to:
receive a read request for one of the non-parity flash chips that is being written to, and
generate read data from data stored in the other non-parity flash chips and the i parity flash chips within the same flash chip group.

17. A method of processing a request via a controller of a solid state drive (SSD), the method comprising:
selecting a first request from a request queue, the first request being directed to a request flash chip;
determining that the first request is a read request; and
based on determining that the first request is a read request:
resetting an iteration parameter ($\alpha$);
determining that equation (1):

$$T_{RemainingWrite} > \alpha(T_{Read} + T_{channelXfer}) \ldots \text{does not hold; and} \tag{1}$$

based on determining that the equation (1) does not hold, issuing the first request, wherein $T_{RemainingWrite}$ is an amount of time remaining before a current write is complete, $T_{Read}$ is an amount of time required to perform a read from a chip, and $T_{channelXfer}$ is an amount of time required to transfer data over a channel from a chip to memory.

18. The method of claim 17, the method further comprising:
selecting a second request from the request queue;
determining that the second request is a read request; and
based on determining that the second request is a read request:
determining that the equation (1) does hold, and
reconstructing the request by reading from other flash chips within a same flash chip group as the request flash chip.

19. The method of claim 18, wherein the method further comprises:
selecting a third request from the request queue;
determining that the third request is a write request; and
based on determining that the third request is a write request:
incrementing $\alpha$ using the following equation (2):

$$\alpha = \alpha * \beta \tag{2},$$

where $\beta$ is an increment parameter;
determining that the equation (1) does not hold; and
based on determining that the equation (1) does not hold, issuing a write on a next flash chip in the same flash chip group.

20. The method of claim 19, wherein based on determining that the third request is a write request and the equation (1) holds, the request is not scheduled.

* * * * *